(12) United States Patent
Shioji et al.

(10) Patent No.: US 9,748,455 B2
(45) Date of Patent: Aug. 29, 2017

(54) SEMICONDUCTOR ELEMENT, SEMICONDUCTOR DEVICE INCLUDING THE SAME, AND METHOD FOR MANUFACTURING SEMICONDUCTOR ELEMENT

(71) Applicant: Nichia Corporation, Anan-shi, Tokushima (JP)

(72) Inventors: Shuji Shioji, Komatsushima (JP); Masafumi Kuramoto, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/146,565

(22) Filed: May 4, 2016

(65) Prior Publication Data

US 2016/0247988 A1 Aug. 25, 2016

Related U.S. Application Data

(63) Continuation of application No. 14/581,826, filed on Dec. 23, 2014, now Pat. No. 9,362,190.

(30) Foreign Application Priority Data

Dec. 25, 2013 (JP) .................................. 2013-266437
Nov. 18, 2014 (JP) .................................. 2014-233970

(51) Int. Cl.
*H01L 33/60* (2010.01)
*H01L 23/15* (2006.01)
(Continued)

(52) U.S. Cl.
CPC .............. *H01L 33/60* (2013.01); *H01L 23/15* (2013.01); *H01L 29/41* (2013.01); *H01L 33/46* (2013.01);
(Continued)

(58) Field of Classification Search
CPC ......... H01L 23/15; H01L 29/41; H01L 33/46; H01L 33/60; H01L 2224/45144; H01L 2224/48247
See application file for complete search history.

(56) References Cited

U.S. PATENT DOCUMENTS

| 5,798,536 A | 8/1998 | Tsutsui |
| 2004/0087050 A1 | 5/2004 | Uemura et al. |

(Continued)

FOREIGN PATENT DOCUMENTS

| JP | 2001-284642 A | 10/2001 |
| JP | 2001-284942 A | 10/2001 |

(Continued)

OTHER PUBLICATIONS

Extended European Search Report issued in European Patent Application No. 14199933.4 dated May 22, 2015.

(Continued)

*Primary Examiner* — Nathan W Ha
(74) *Attorney, Agent, or Firm* — Foley & Lardner LLP

(57) ABSTRACT

To provide a semiconductor element that can have the high adhesion between a substrate made of an oxide or the like and a metal film, a semiconductor element includes a substrate made of an oxide, a semiconductor element structure provided on an upper surface of the substrate, and a metal film provided on a lower surface of the substrate, in which the metal film contains nanoparticles made of an oxide.

26 Claims, 11 Drawing Sheets

(51) Int. Cl.
*H01L 29/41* (2006.01)
*H01L 33/46* (2010.01)

(52) U.S. Cl.
CPC ............ *H01L 2224/45144* (2013.01); *H01L 2224/48247* (2013.01); *H01L 2224/48257* (2013.01); *H01L 2224/48465* (2013.01); *H01L 2224/49107* (2013.01); *H01L 2224/49113* (2013.01); *H01L 2933/0058* (2013.01)

(56) References Cited

U.S. PATENT DOCUMENTS

| | | |
|---|---|---|
| 2005/0133799 A1 | 6/2005 | Uemura et al. |
| 2006/0222869 A1* | 10/2006 | Cai ................. B82Y 30/00 428/447 |
| 2007/0245489 A1 | 10/2007 | Boudreau |
| 2007/0275489 A1 | 11/2007 | Zhou |
| 2007/0278422 A1* | 12/2007 | Einhorn ............ B82Y 20/00 250/462.1 |
| 2008/0185609 A1 | 8/2008 | Kozawa et al. |
| 2009/0065763 A1 | 3/2009 | Kamiyama et al. |
| 2009/0240013 A1 | 9/2009 | Timmons et al. |
| 2010/0127369 A1 | 5/2010 | Seki et al. |
| 2010/0186999 A1 | 7/2010 | Kuramoto et al. |
| 2011/0198558 A1 | 8/2011 | Okai et al. |
| 2011/0236715 A1* | 9/2011 | Polcyn ............. C03C 17/36 428/623 |
| 2012/0003711 A1* | 1/2012 | Tseng ........... B01L 3/502707 435/177 |
| 2012/0012889 A1 | 1/2012 | Okabe et al. |
| 2012/0050732 A1* | 3/2012 | Lu ................. B05D 1/204 356/301 |
| 2012/0107631 A1* | 5/2012 | Chiu ............... B82Y 30/00 428/552 |
| 2012/0119200 A1* | 5/2012 | Ueno .............. C09K 11/02 257/40 |
| 2012/0122014 A1* | 5/2012 | Brinkman ........ B82Y 30/00 429/482 |
| 2012/0168206 A1 | 7/2012 | Sekine et al. |
| 2012/0205616 A1 | 8/2012 | Zhang et al. |
| 2012/0219800 A1* | 8/2012 | Torimoto ........ B01J 13/02 428/402 |
| 2012/0245017 A1* | 9/2012 | Adzic ............. C25D 5/20 502/1 |
| 2012/0282132 A1 | 11/2012 | Watkins et al. |
| 2013/0069034 A1* | 3/2013 | Hirayama ....... H01L 33/04 257/13 |
| 2014/0144501 A1 | 5/2014 | Jung et al. |
| 2014/0224326 A1 | 8/2014 | Ku et al. |
| 2014/0327031 A1 | 11/2014 | Li et al. |
| 2014/0342104 A1 | 11/2014 | Tauchi et al. |
| 2015/0122314 A1 | 5/2015 | Snaith et al. |

FOREIGN PATENT DOCUMENTS

| | | |
|---|---|---|
| JP | 2001-332762 A | 11/2001 |
| JP | 2008-192782 A | 8/2008 |
| JP | 2010-153825 A | 7/2010 |
| JP | 2010-263016 A | 11/2010 |
| JP | 2011-222603 A | 11/2011 |
| JP | 2012-062564 A | 3/2012 |
| JP | 2012-169355 A | 9/2012 |
| JP | 2013-151735 A | 8/2013 |
| JP | 2013-243253 A | 12/2013 |
| WO | WO-2007/136097 A1 | 11/2007 |

OTHER PUBLICATIONS

Non-Final Office Action for U.S. Appl. No. 14/581,826 mailed Jul. 30, 2015.

Notice of Allowance for U.S. Appl. No. 14/581,826 mailed Feb. 10, 2016.

* cited by examiner

SEMICONDUCTOR ELEMENT, SEMICONDUCTOR DEVICE INCLUDING THE SAME, AND METHOD FOR MANUFACTURING SEMICONDUCTOR ELEMENT

CROSS-REFERENCE TO RELATED APPLICATIONS

The present application is a continuation of U.S. patent application Ser. No. 14/581,826, filed Dec. 23, 2014, which claims priority under 35 U.S.C. §119 to Japanese Patent Application No. 2013-266437, filed on Dec. 25, 2013, and Japanese Patent Application No. 2014-233970, filed on Nov. 18, 2014. The contents of these applications are incorporated herein by reference in their entirety.

BACKGROUND OF THE INVENTION

Field of the Invention

The disclosure relates to a semiconductor element, a semiconductor device including the same, and a method for manufacturing the semiconductor element.

Description of the Related Art

Conventionally, semiconductor light emitting elements that include a reflective layer formed of metal, such as silver, on a backside of a substrate made of an oxide or the like, such as sapphire, have been studied regarding adhesion between the substrate and the reflective layer (see, for example, JP 2001-332762 A and JP 2001-284942 A).

However, an adhesion between a metal film and a substrate made of an oxide or the like still has room for improvement.

SUMMARY OF THE INVENTION

Accordingly, the present invention has been made in view of the foregoing circumstances, and it is an object of the present invention to provide a semiconductor element that can have the high adhesion between a substrate made of an oxide or the like and a metal film, a semiconductor device including the same, and a method for manufacturing the semiconductor element.

In order to solve the foregoing problems, a semiconductor element according to one aspect of the present invention includes a substrate made of an oxide, a semiconductor element structure provided on an upper surface of the substrate, and a metal film provided on a lower surface of the substrate, in which the metal film contains nanoparticles made of an oxide.

A semiconductor element according to another aspect of the present invention includes a substrate made of a nitride, a semiconductor element structure provided on an upper surface of the substrate, and a metal film provided on a lower surface of the substrate, in which the metal film contains nanoparticles made of a nitride.

A semiconductor element according to another aspect of the present invention includes a substrate made of a carbide, a semiconductor element structure provided on an upper surface of the substrate, and a metal film provided on a lower surface of the substrate, wherein the metal film contains nanoparticles made of a carbide.

The semiconductor device according to one aspect of the present invention includes a base substrate, and the semiconductor element of the present invention, in which a lower surface side of the semiconductor element is bonded to the base substrate.

A method for manufacturing a semiconductor element according to one aspect of the present invention is a method for manufacturing the semiconductor element having a semiconductor element structure on an upper surface of a substrate made of an oxide. The method includes a step of simultaneously depositing a metal and an oxide on a lower surface of the substrate by sputtering or vapor deposition to form a film of the metal containing nanoparticles of the oxide.

A method for manufacturing a semiconductor element according to another aspect of the present invention is a method for manufacturing the semiconductor element having a semiconductor element structure on an upper surface of a substrate made of an oxide. The method includes steps of dispersedly attaching nanoparticles made of an oxide to a lower surface of the substrate by sputtering or vapor deposition, and then forming a metal film to cover the nanoparticles.

A method for manufacturing a semiconductor element according to another aspect of the present invention is a method for manufacturing the semiconductor element having a semiconductor element structure on an upper surface of a substrate made of a nitride. The method includes a step of simultaneously depositing a metal and a nitride on a lower surface of the substrate by sputtering or vapor deposition to form a film of the metal containing nanoparticles of the nitride.

A method for manufacturing a semiconductor element according to another aspect of the present invention is a method for manufacturing the semiconductor element having a semiconductor element structure on an upper surface of a substrate made of a nitride. The method includes steps of dispersedly attaching nanoparticles made of a nitride to a lower surface of the substrate by sputtering or vapor deposition, and then forming a metal film to cover the nanoparticles.

A method for manufacturing a semiconductor element according to another aspect of the present invention is a method for manufacturing the semiconductor element having a semiconductor element structure on an upper surface of a substrate made of a carbide. The method includes a step of simultaneously depositing a metal and a carbide on a lower surface of the substrate by sputtering or vapor deposition to form a film of the metal containing nanoparticles of the carbide.

A method for manufacturing a semiconductor element according to another aspect of the present invention is a method for manufacturing the semiconductor element having a semiconductor element structure on an upper surface of a substrate made of a carbide. The method includes steps of dispersedly attaching nanoparticles made of a carbide to a lower surface of the substrate by sputtering or vapor deposition, and then forming a metal film to cover the nanoparticles.

Accordingly, the present invention provides the semiconductor element having the metal film with excellent adhesion to the substrate made of oxide, nitride, or carbide.

DETAILED DESCRIPTION OF THE EMBODIMENT

Preferred embodiments of the present invention will be described below with reference to the accompanying drawings as appropriate. Note that a semiconductor element, a manufacturing method thereof, and a semiconductor device equipped with the same that will be described below are intended to embody the technical idea of the present invention, and not to restrict the scope of the present invention to the following embodiments unless otherwise specified. In some drawings, the sizes or positional relationships of members are emphasized to clarify the description below. The contents of one embodiment and Example mentioned below can also be applied to other embodiments and Examples.

First Embodiment

Figure 1A:
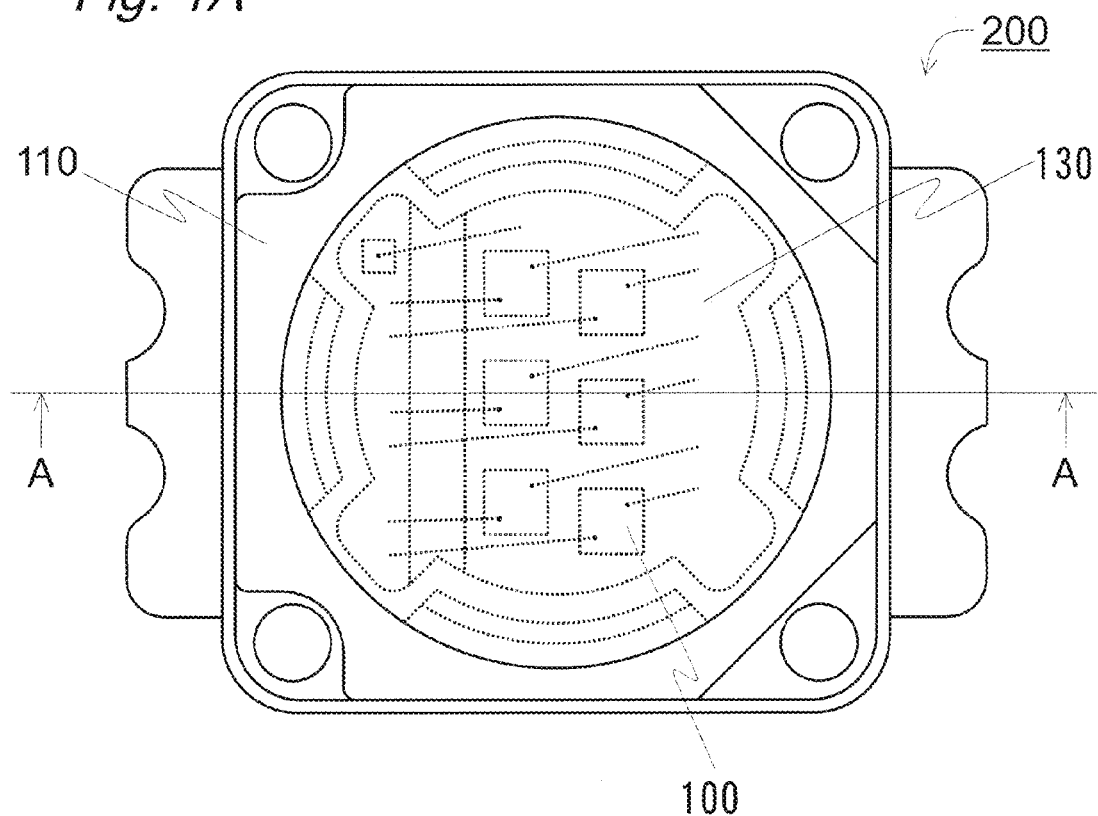
FIG. 1A is a schematic top view of a semiconductor device according to one embodiment of the present invention.
Figure 1B:
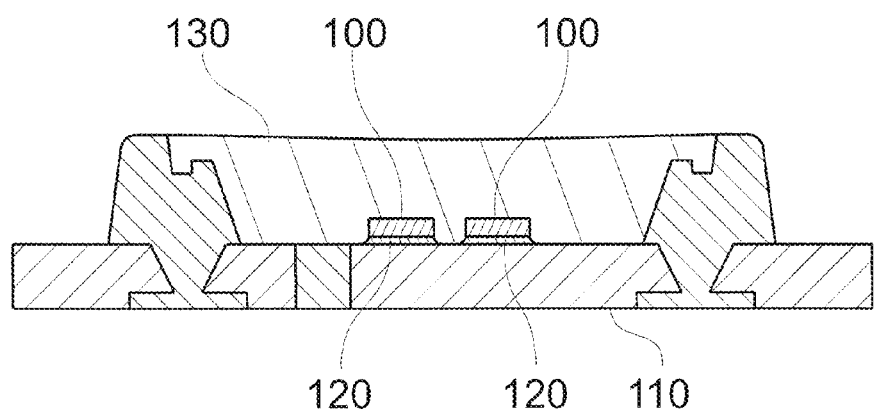
FIG. 1B is a schematic cross-sectional view taken along the line A-A of FIG. 1A.
Figure 2A:
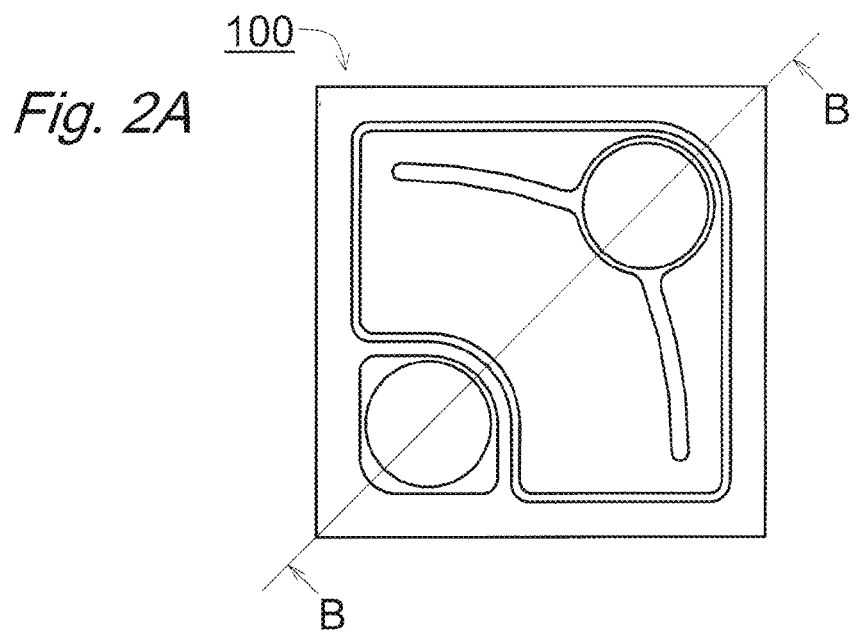
FIG. 2A is a schematic top view of a semiconductor element mounted on the semiconductor device shown in FIGS. 1A and 1B.
Figure 2B:
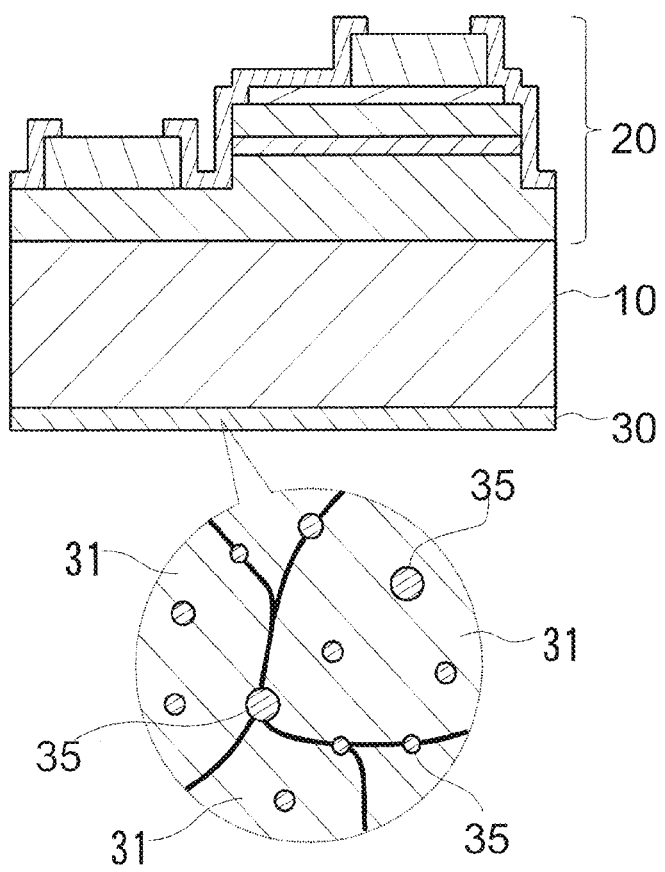
FIG. 2B is a schematic cross-sectional view taken along the line B-B of FIG. 2A.

FIG. 1A shows a schematic top view of a semiconductor device according to a first embodiment of the present invention, and FIG. 1B shows a schematic cross-sectional view taken along the line A-A of FIG. 1A. FIG. 2A is a schematic top view of a semiconductor element mounted on the semiconductor device shown in FIGS. 1A and 1B, and FIG. 2B is a schematic cross-sectional view taken along the line B-B of FIG. 2A.

As shown in FIG. 1, a semiconductor device 200 of the first embodiment includes a semiconductor element 100, and a base substrate 110. The lower surface side of the semiconductor element 100 is bonded to the base substrate 110.

More specifically, the semiconductor device 200 is a surface mount type LED. The semiconductor device 200 includes the semiconductor element 100 which is a LED element, the base substrate 110 with a recessed portion for accommodating therein the semiconductor element 100, and a sealing member 130 provided in the recessed portion to cover the semiconductor elements 100. The base substrate 110 is a package that includes a pair of positive and negative lead electrodes, and a resin molding body for integrally holding the lead electrodes. The bottom surface of the recessed portion in the base substrate 110 includes the surfaces of the lead electrodes. The semiconductor element 100 is bonded to the bottom surface (more specifically, the surface of one lead electrode) of the recessed portion of the base substrate 110 via a bonding member 120, and connected to one and the other lead electrodes via a wire. The sealing member 130 may contain a phosphor, a filler, and the like.

As shown in FIG. 2, the semiconductor element 100 in the first embodiment includes a substrate 10 made of an oxide, a semiconductor element structure 20 provided on an upper surface of the substrate 10, and a metal film 30 provided on a lower surface of the substrate 10. The metal film 30 contains nanoparticles 35 of an oxide.

In this way, the presence of the nanoparticles 35 in the metal film 30 can enhance the adhesion of the metal film 30 with the substrate 10, which makes it possible to produce the semiconductor element with high reliability. Further, the use of the metal film 30 containing the nanoparticles 35 can simplify the layer structure while obtaining the effect of enhancing the adhesion at low cost as compared to the case where an oxide film (layer) intervenes in between the substrate 10 and a metal film not containing nanoparticles to enhance the adhesion. Therefore, the loss of light due to the intervening film is suppressed, which can provide the light emitting element with excellent light extraction efficiency and the light receiving element with excellent light receiving efficiency. Further, the semiconductor element with excellent heat dissipation properties can be provided.

The presence of the nanoparticles 35 in the metal film 30 exhibits a pinning effect, which can suppress the growth of crystal grains 31 of metal (element) as a principal component of the metal film 30 (hereinafter abbreviated as a simply "crystal grain 31"). Thus, the growth of the crystal grains 31 due to the thermal history of an assembly process of the semiconductor device can be suppressed, thereby maintaining the smoothness of the surface of the metal film 30, and suppressing occurrence of hollows (voids) in the metal film 30. Therefore, the metal film 30 tends to maintain the high reflectivity and heat dissipation property.

Figure 3A:
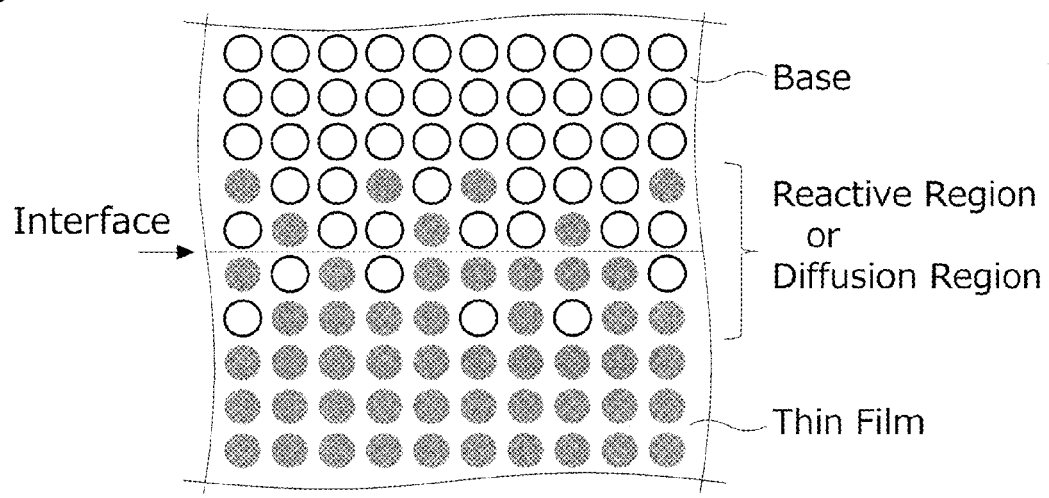
FIG. 3A is an schematic diagram for explaining bonding between a base and a thin film.
Figure 3B:
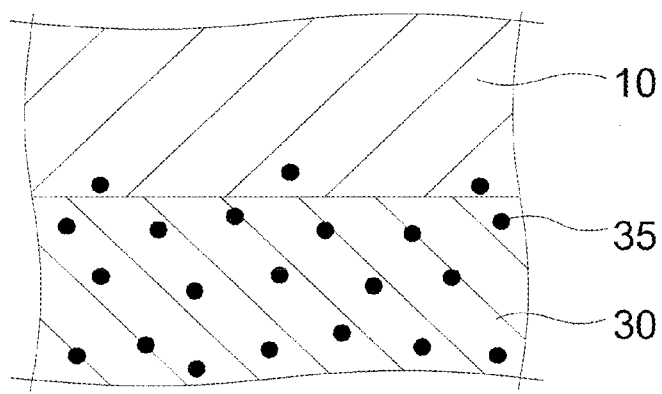
FIGS. 3B and 3C are schematic diagrams for explaining the bonding between a substrate and a metal film in the one embodiment of the present invention.
Figure 3C:
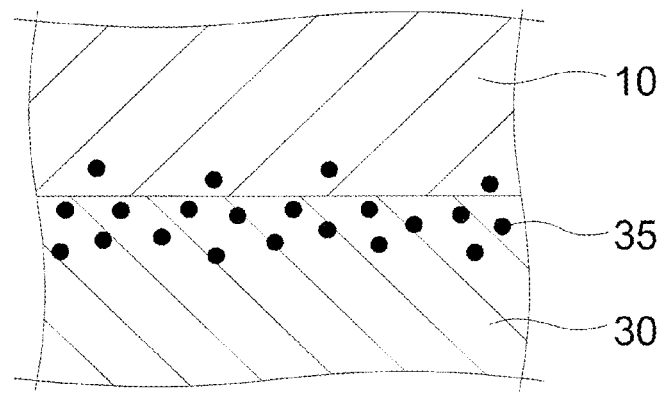

FIG. 3A is an schematic diagram for explaining the bonding between the base and the thin film. FIGS. 3B and 3C are schematic diagrams for explaining the bonding between the substrate and the metal film in the first embodiment. As shown in FIG. 3A, generally, when a thin film is formed on a base, in the vicinity of an interface therebetween, a reaction region due to formation of compounds, or a diffusion region due to diffusion of atoms can be formed, enhancing the adhesion between the base and the thin film. For example, when depositing a thin film made of metal which is likely to be oxidized, on the base made of the oxide, the reaction region in the vicinity of the interface therebetween where a metal oxide of the component of the thin film is generated is more likely to be formed, which can easily achieve the adequate adhesion. On the other hand, when depositing a thin film made of metal which is less likely to be oxidized, on the base made of the oxide, such a reaction region is not easily formed, which cannot easily achieve the adequate adhesion.

Thus, as shown in FIG. 3B, suppose that the nanoparticles 35 made of the oxide are contained in the metal film 30. In this way, it can be assumed that the reaction region can be formed in the vicinity of the interface between the substrate 10 and the metal film 30 in a pseudo manner, thereby enhancing the adhesion between the oxide of the metal film 30 and the substrate 10.

From the viewpoint of enhancing the adhesion of the metal film 30 to the substrate 10, the nanoparticles 35 preferably exist at least in the vicinity of the interface between the substrate 10 and the metal film 30. As shown in FIG. 3B, the nanoparticles 35 diffused across the entire area of the metal film 30 tend to suppress the growth of crystals over the entire area of the metal film 30. On the other hand, as shown in FIG. 3C, the nanoparticles 35 existing more on the upper side of the metal film 30, that is, on the substrate 10 side can enhance the adhesion between the substrate 10 and the metal film 30 by efficiently using the nanoparticles 35. In particular, the nanoparticles 35 that are unevenly or locally distributed in the vicinity of the interface between the substrate 10 and the metal film 30 in the metal film 30 can suppress the reduction in reflectivity of the metal film 30 and the increase in electric resistance, while enhancing the adhesion between the substrate 10 and the metal film 30.

Figure 4A:
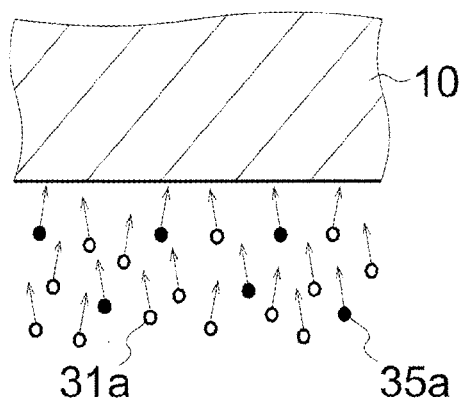
FIGS. 4A and 4B are schematic diagrams for explaining one example of a semiconductor element and a manufacturing method thereof in the one embodiment of the present invention.
Figure 4B:
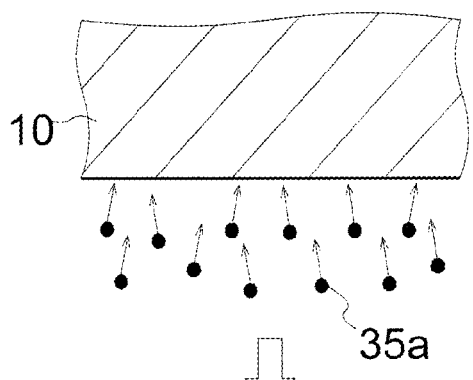
Figure 4B:
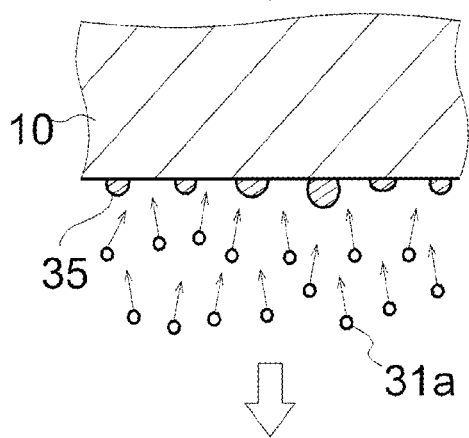
Figure 4B:
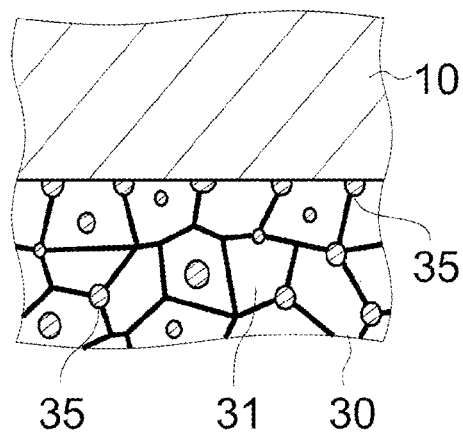
Figure 4B:
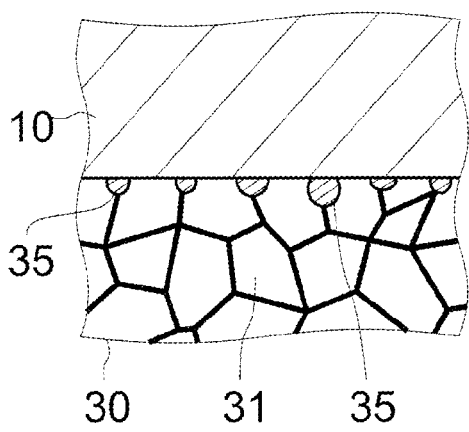

FIGS. 4A and 4B are schematic diagrams for explaining one example of a semiconductor element and a manufacturing method thereof in the first embodiment of the present invention. As shown in FIG. 4A, one example of the manufacturing method of the semiconductor element 100 in the first embodiment is a method for manufacturing the semiconductor element with a semiconductor element structure on an upper surface of the substrate 10 made of the oxide. The method includes a step of simultaneously depositing a metal and an oxide on a lower surface of the substrate by sputtering or vapor deposition to form a film of the metal containing nanoparticles of the oxide. Simultaneously supplying raw material 31a for metal and raw material 35a for the nanoparticles to the lower surface of the substrate 10 makes it possible to disperse the nanoparticles 35 across the entire area of metal film 30. In this case, the nanoparticles 35 include not only particles attached to the lower surface of the substrate 10, but also particles existing in the metal crystal grains 31 as well as in a crystal grain boundary of the metal.

As shown in FIG. 4B, another example of the manufacturing method of the semiconductor element 100 in the first embodiment is a method for manufacturing the semiconductor element with a semiconductor element structure on an upper surface of the substrate 10 made of the oxide. The method includes steps of dispersedly attaching the nanoparticles 35 of the oxide onto the lower surface of the substrate 10 by sputtering or vapor deposition, and then forming the metal film to cover the nanoparticles 35. The raw material 35a for the nanoparticles is first supplied to the lower surface of the substrate 10, and then the raw material 31a for the metal is supplied thereto. In this way, those raw materials are independently supplied, so that the nanoparticles 35 in the metal film 30 can be dispersedly attached to the lower surface of the substrate 10. This is one example in which the nanoparticles 35 in the metal film 30 locally exist in the vicinity of the interface with the substrate 10. At this time, in order to dispersedly attach the nanoparticles 35 to the lower surface of the substrate 10, the film made of the raw material 35a is deposited in a thickness of less than 10 nm, preferably, less than 5 nm, so that the nanoparticles 35 can be formed dispersedly, that is, in the form of particles, and not in the form of film (layer) that covers the entire lower surface of the substrate.

Preferred embodiment of the metal film 30 will be described below.

As shown in FIGS. 2A and 2B, the nanoparticles 35 preferably exist at least in the crystal grain boundaries of the metal film 30. The present of the nanoparticles 35 in the crystal grain boundaries of the metal film 30 can easily suppress the movement of the grain boundary by the pinning effect, thereby effectively inhibiting the growth of the crystal grains 31. Other metal atoms, such as copper, can be preventing from diffusing into the crystal grain boundaries of the metal film 30. Further, oxygen in the air can be suppressed from invading the metal film 30 to be diffused into the crystal grain boundaries. Thus, even after the assembly process or continuous driving of the semiconductor device, the metal film 30 can be suppressing from being peeled from the substrate 10, while keeping its high reflectivity. This can provide the reflective film with excellent reliability. The metal film 30 can obtain these effects at low cost, and can also simplify the layer structure under the metal film 30, as compared to the case in which a barrier layer is additionally formed.

The nanoparticle 35 preferably includes at least one material selected from the group consisting of silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, nickel oxide, ITO($In_2O_3$:Sn), IZO (ZnO:In), AZO(ZnO:Al), GZO(ZnO:Ga), and FTO($SnO_2$:F). Further, hafnium oxide is also preferable. The nanoparticle 35 also preferably includes an oxide of at least one element selected from a Group 4 element, a Group 10 element, a Group 12 element, a Group 13 element, and a Group 14 element. Among them, silicon oxide, aluminum oxide, zirconium oxide, and titan oxide are easily available and relatively inexpensive.

The content of the nanoparticles 35 in the metal film 30 is sufficient to be more than 0% by weight and its upper limit is not specifically limited from the viewpoint of enhancing adhesion with the substrate 10, but for example, 0.2% by weight or more, preferably 0.5% by weight or more, and more preferably 1% by weight or more. The content of the nanoparticles 35 in the metal film 30 is, for example, 5% by weight or less, preferably 4% by weight or less, and more preferably 2.5% by weight or less from the viewpoint of the reflectivity (initial reflectivity) of the metal film 30.

An average particle diameter of the nanoparticle 35 is not specifically limited, but preferably is 0.1 nm or more and 100 nm or less, and more preferably 0.1 nm or more and 10 nm or less. In this way, a greater number of nanoparticles 35 can be dispersed into the metal film 30 by addition of a small amount of the nanoparticles, thereby inhibiting the growth of the crystal grains 31. Note that the average particle diameter of the nanoparticle 35 can be defined by $D_{50}$. The average particle diameter of the nanoparticle 35 can be measured by a laser diffraction-scattering method, an image analysis method (scanning electron microscope (SEM), transmission electron microscope (TEM)), a dynamic light scattering, an X-ray small angle scattering method, or the like, and preferably an image analysis method among them. The image analysis method is in conformance with, for example, JIS Z 8827-1:2008.

The shapes of the nanoparticle 35 are not specifically limited thereto, but can include, for example, a spherical shape, an irregular crushed shape, a needle-like shape, a columnar shape, a plate-like shape (including a scale-like shape), a fiber-like shape, a dendritic shape, and the like. Among them, the spherical nanoparticles 35 permit the speedy extraction of light therefrom while suppressing the total reflection, even though the light propagates through the relatively large nanoparticle 35 having a size that interferes with visible light. As a result, the metal film 30 with excellent reflectivity can be easily obtained.

The substrate 10 has transparency, allowing the metal film 30 to serve as the light reflective film. Further, the nanoparticle 35 also preferably has transparency. Another means for suppressing the crystal growth of the metal film due to the thermal history is also considered which involves adding a different kind of metal to the metal film for the purpose of exhibiting a solute drag effect. However, the different kind of metal has a relatively light-absorbing property, which might cause a non-negligible loss of light considering light scattering within the semiconductor device. However, the nanoparticles 35 that have the transparency can suppress the loss of light to a small level.

The substrate 10 has electrical conductivity, whereby the semiconductor element 100 can have the vertical electrode (counter-electrode) structure, which easily feeds electric power to the semiconductor element structure 20 uniformly in the plane thereof, thereby improving power efficiency with ease. Further, the nanoparticles 35 that have electrical conductivity can suppress the increase in electric resistance of the metal film 30.

Formation methods of the metal film 30 are not specifically limited, but can include sputtering, vapor deposition, and the like. The thickness of the metal film 30 can be any value arbitrarily selected, but for example, 0.03 μm or more and 5.0 μm or less, preferably 0.05 μm or more and 3.0 μm or less, and more preferably 0.1 μm or more and 1.0 μm or less.

Metal (element) as the principal component of the metal film 30 is not specifically limited, but is preferably metal that does not tend to be easily oxidized from the viewpoint of the difficulty in obtaining the adhesion to the substrate 10 of the oxide as mentioned above. Specifically, the metal materials can include silver, gold, platinum, palladium, rhodium, iridium, ruthenium, osmium, copper, tin, and the like. Among them, particularly, silver and gold are less likely to achieve the adequate adhesion to the substrate 10 made of the oxide. Silver has excellent light reflectivity, especially, the highest reflectivity in a visible wavelength range among metals. Further, silver has optimal performance in terms of thermal conductivity and electric resistance among the metals. Thus, the metal film 30 is preferably a film containing silver as a principal component.

Figure 5:
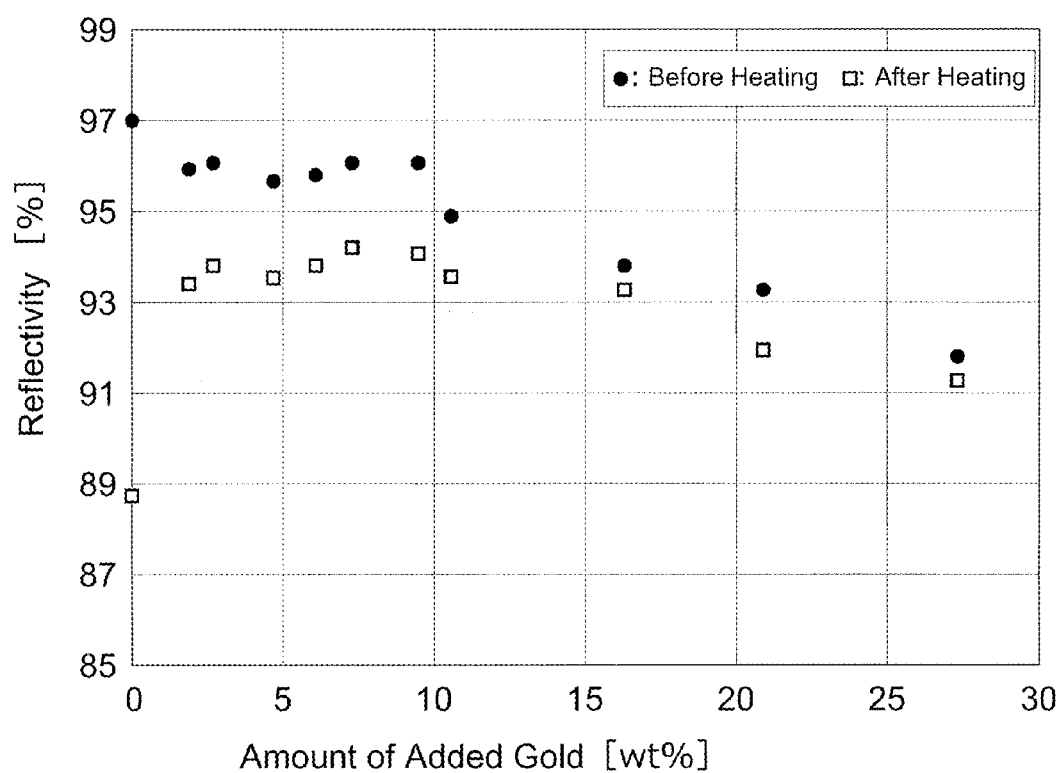
FIG. 5 is a graph showing the relationship between the amount of gold added to a silver film, and its reflectivity.

Silver forms not only a solid solution and an intermetallic compound with impurities of a different kind of metal, but also a compound with non-metallic impurities made of, e.g., selenium or sulfur. These impurities promote the phenomenon of inhibition of the crystal growth, which is called the pinning effect or solute drag effect, but might reduce the reflectivity of the silver film. Especially, in the light emitting device containing a light diffusion component, such as phosphor, the influence of pits and projections on the silver film or light absorption is increased by the light diffusion, causing the non-negligible loss of light. Thus, in order to gain the same level of reflectivity as that of pure silver, it is preferable to keep a certain high degree of purity of silver high to some degrees. For example, aluminum is a metal that tends to easily obtain the adhesion to the oxide substrate, and having the second highest reflectivity after silver. For this reason, the maximum (upper limit) amount of impurities added to the silver film can be set such that the reflectivity of the silver film (which is called a film containing silver as a principal component by addition of impurities) is equal to that of aluminum. In other words, the purity of silver is preferably such a purity that can maintain the reflectivity of the film containing silver as a principal component to a reflectivity of aluminum or higher. The loss of light due to absorption differs depending on chemical species of impurities even in the same added amount thereof. However, gold can form an all proportional solid solution with silver. Thus, the gold can obtain a uniform metal composition without segregation of intermetallic compounds or the like, thereby reducing variations in reflectivity, and thus serve as an impurity that can be added in a large amount. By taking the gold as one example, the maximum amount of impurities substantially added to the silver film can be substantially defined. FIG. 5 is a graph showing the relationship between the amount of gold added to the silver film, and its reflectivity. More specifically, FIG. 5 is a graph illustrating the relationship between the amount of gold added to the silver film formed by sputtering and the reflectivity (at a wavelength of 450 nm) of the silver film before and after a heat treatment. The conditions for the heat treatment are as follows: 250° C. and 2 hours in the air atmosphere. As can be seen from FIG. 5, preferably, the high reflectivity of about 96% is maintained until the amount of added gold reaches 9% by weight, and the purity of silver is 91% or more. Further, in order to gain the same level of reflectivity as that of pure silver, the purity of silver is more preferably 99% or more. Note that the purity of silver indicates a rate of silver except for impurities that form any compound by being alloyed or reacted with silver. The nanoparticle 35 is not considered to belong to such an impurity.

Silver is a polycrystalline body, in which as the crystal grain grows in three dimensions, its surface becomes rougher with a diffusion reflection increased, and thus can visually seem to be whitened. Even the high-pure silver slightly absorbs light, so that its reflectivity is reduced because of the increase in light absorption due to the diffuse reflection. In order to cause the surface of the silver film to be a mirror surface or a surface with a glossiness of 1.5 or more, it is necessary to decrease the average particle diameter of silver to such a degree that hardly interfere with the visible light. Specifically, this can be achieved by decreasing the average particle diameter of silver to less than 50 nm that is largely below one fourth of the shortest wavelength of the visible light, namely, 380 nm. For example, in the electrolytic plating, in order to decrease the average particle diameter, it is necessary to suppress the crystallinity by increasing the concentration of the impurities in the silver film. As the concentration of impurities is increased, the light absorption is enhanced. In this case, even though the average particle diameter is decreased to form the mirror surface, that is, the surface with high glossiness, the reflectivity is reduced. Sputtering can achieve this state only under a condition that is not economically competitive as compared to the electrolytic plating. For this reason, the average particle diameter of silver is preferably 50 nm or more and 1.0 μm or less, and more preferably, 50 nm or more and 0.5 μm or less.

Second Embodiment

A semiconductor element and a manufacturing method thereof in a second embodiment of the present invention differs from the first embodiment that the substrate 10 and nanoparticles 35 are changed to those made of a nitride. Such semiconductor element and the manufacturing method thereof in the second embodiment can also exhibit the same operations and effects as those of the first embodiment.

The nanoparticle 35 in the second embodiment preferably includes at least one material selected from the group consisting of silicon nitride, aluminum nitride, zirconium nitride, titanium nitride, zinc nitride, magnesium nitride, gallium nitride, tantalum nitride, niobium nitride, bismuth nitride, yttrium nitride, iridium nitride, indium nitride, tin nitride, nickel nitride, and hafnium nitride. The nanoparticle 35 also preferably includes a nitride of at least one element selected from a Group 4 element, a Group 10 element, a Group 12 element, a Group 13 element, and a Group 14 element.

Third Embodiment

A semiconductor element and a manufacturing method thereof in a third embodiment of the present invention differ from the first embodiment that the substrate 10 and nanoparticles 35 are changed to those made of a carbide. The semiconductor element and the manufacturing method thereof in the third embodiment can also exhibit the same operations and effects as those of the first embodiment.

The nanoparticle 35 in the third embodiment preferably includes at least one material selected from silicon carbide, zirconium carbide, titanium carbide, tantalum carbide, niobium carbide, yttrium carbide, and hafnium carbide.

The components of the semiconductor element and semiconductor device in the present invention will be described below.

(Semiconductor Element 100)

The semiconductor element includes at least a substrate and a semiconductor element structure. The semiconductor element may be not only the light emitting element, but also a light receiving element, or an electronic element. Examples of the light emitting element include a light emitting diode (LED), a semiconductor laser (LD), and the like. Examples of the light receiving element include a photodiode, a solar battery, and the like. Examples of the electronic element include a transistor, an IC, an LSI, and the like. The top surface shape of the semiconductor element is preferably a quadrilateral shape, especially, a square, or a rectangular one of which is longer in one direction, but may be other shapes. The side surface of the semiconductor element (especially, substrate) may be substantially perpendicular to its upper surface, or inclined inward or outward. The semiconductor element may have a structure with both of p and n electrodes on the same surface side, or have a counter-electrode (vertical electrode) structure with p and n electrodes independently provided the upper and lower surfaces of the element, respectively. In the semiconductor element having the structure with both p and n electrodes on the same surface side, the respective electrodes are connected to lead electrodes or wirings via wires (face-up mount). In the semiconductor element having the counter-electrode structure, the lower surface electrode is bonded to the lead electrode or wiring via a conductive bonding member, and the upper surface electrode is connected to the other lead electrode or wiring via a wire. The number of the semiconductor elements mounted on one semiconductor device may be one or plural. The semiconductor elements can be connected in series or in parallel.

(Substrate 10)

As the substrate, a substrate for crystal growth that allows the growth of crystals of a semiconductor forming the semiconductor element structure is preferable because of its convenience, or may be a substrate for bonding that is bonded to a semiconductor element structure separated from the substrate for crystal growth. Materials for the substrate made of an oxide include aluminum oxide (sapphire), an aluminum magnesium oxide (spinel), magnesium oxide, zinc oxide, gallium oxide, titanium oxide, strontium titaninate, neodymium gallate, lithium gallate, lanthanum aluminate, lithium aluminate, silicon oxide, and the like. The material for the substrate made of a nitride includes a material represented by $Al_xGa_{1-x}N$ ($0 \leq x \leq 1$), and the like. The material for the substrate made of a carbide includes silicon carbide, and the like. The thickness of the substrate is, for example, 20 μm or more and 1,000 μm or less, and preferably 50 μm or more and 500 μm or less, in terms of the strength of the substrate and the thickness of the semiconductor device.

(Semiconductor Element Structure 20)

The semiconductor element structure can have a light emitting element structure, a light receiving element structure, or an electronic element structure. The semiconductor element structure includes a laminate of semiconductor layers, that is, at least an n-type semiconductor layer and a p-type semiconductor layer, and preferably with an active layer intervening in the layers. Further, the semiconductor element structure may include an electrode and a protective film. The electrode can be formed of, e.g., gold, silver, tin, platinum, rhodium, titanium, aluminum, tungsten, palladium, nickel, or an alloy thereof. The protective film can be formed of an oxide or nitride of at least one kind of element selected from the group consisting of silicon, titanium, zirconium, niobium, tantalum, and aluminum. When the semiconductor element is a light emitting element or a light receiving element, the light emission wavelength or light reception wavelength of the semiconductor element structure can be selected from an ultraviolet range to an infrared range according to the semiconductor material or the mixture ratio of semiconductor materials. A semiconductor material for use is preferably a nitride semiconductor (mainly represented by the following formula: $In_xAl_yGa_{1-x-y}N$, $0 \leq x$, $0 \leq y$, $x+y \leq 1$) which is a material can emit light having a short wavelength which enables efficient excitation of the phosphor, and can realize an electronic device of an high frequency and high temperature operation, and can achieve a high efficient solar battery. In addition, the semiconductor materials for use can include InAlGaAs semiconductor, InAlGaP semiconductor, zinc sulfide, zinc selenide, silicon carbide, and the like.

(Bonding Film)

On the lower surface side of the substrate 10, a bonding film may be further provided under the metal film 30. Materials for the bonding film for use can include, e.g., gold, silver, tin, rhodium, tungsten, nickel, molybdenum, platinum, palladium, titanium, or an alloy thereof. The bonding film may be a single-layer film or a multi-layer film. Formation methods of the bonding film are not specifically limited, but can include sputtering, vapor deposition, and the like. Note that the bonding film may be omitted.

(Semiconductor Device 200)

The semiconductor device includes at least a base substrate and a semiconductor element. The lower surface side of the semiconductor element is bonded to the base substrate. The semiconductor device may be of a surface mount type, or a lead insertion type. The structure of this embodiment exhibits the significant effects when applied to the surface mount type semiconductor device because this type semiconductor device tends to easily cause the crystal growth of the metal film due to the relatively severe thermal history, including reflow soldering and the like. The semiconductor device may include an electrostatic protective element, such as a Zener diode.

(Base Substrate 110)

The base substrate can mainly take the form of a wiring board including a base body and a wiring, or the form of a package including lead electrodes and a molded body. The base substrate for use can be a plate-like one, one that has a recessed portion (cup portion), and the like. The plate-like base substrate makes it easier to mount the semiconductor element thereon, while the base substrate with the recessed portion tends to easily improve the light extraction efficiency. The base substrate can be fabricating by providing the wiring by plating or the like after formation of the molded body, or alternatively by stacking thin plates previously provided with wirings.

(Lead Electrode)

Materials suitable for the lead electrode can be metal that exhibits conductivity by being connected to the semiconductor element. Specifically, the materials include copper, aluminum, gold, silver, tungsten, iron, nickel, cobalt, molybdenum, or an alloy thereof, phosphor bronze, iron-containing copper, and the like. The lead electrode may be configured of a laminate of these metals, but is preferably a single layer because of the simpleness of the structure. In particular, a copper alloy containing copper as a principal component is preferably used. The lead electrode may have as its surface layer, a coating or light reflective film made of silver, aluminum, rhodium, gold, copper, or an alloy thereof. Among them, silver which has excellent reflectivity is preferable. The lead electrode is obtained as a part of each semiconductor device, for example, by singulating the lead frame by cutting and forming. The lead frame includes, as the base body, a metal plate made of the above-mentioned material and which undergoes various processes, including pressing, etching, rolling, and the like. The thickness of the lead electrode can be any value arbitrarily selected, but, for example, 0.1 mm or more and 1 mm or less, and preferably 0.2 mm or more and 0.4 mm or less.

(Molded Body)

The molded body is integrally formed with the lead electrodes to thereby configure the package. Base material for the molded body can include thermosetting resin, such as epoxy resin, silicon resin, a modified resin thereof, a hybrid resin; or thermoplastic resin, such as aliphatic polyamide resin, a semi-aromatic polyamide resin, or polycyclohexane terephthalate. The molded body may contain powder or fiber of, e.g., glass, calcium silicate, calcium titanate, titanium oxide, or carbon black, as a filler or coloring pigment into the base material.

(Wiring Substrate)

The base body of the wiring substrate may have electrical insulating properties, but can be electrically insulated from the wiring via an insulating film or the like even though the base body has electrical conductivity. Materials of the base body for the wiring substrate can include ceramics, such as aluminum oxide, aluminum nitride, or a mixture thereof; metal, such as copper, iron, nickel, chromium, aluminum, silver, gold, titanium, or an alloy thereof; resin, such as epoxy resin, BT resin, polyimide resin; and a fiber-reinforced resin (reinforced material being glass) thereof. The wiring substrate can be a rigid substrate, or a flexible substrate (flexible substrate) that can be set depending on the material or thickness of the base body. The wiring substrate is not limited to the form of a flat plate, but can also have the form of a recessed portion, like the above-mentioned package.

The wiring is formed over at least an upper surface of the base body, and may be formed inside, and over the lower surface and side surfaces of the base body. The wiring may have a land (die pad) portion with the semiconductor element bonded thereto, a terminal portion for external connection, and a withdrawn wiring portion for connection between the land portion and the terminal portion. Materials for the wiring can include copper, nickel, palladium, rhodium, tungsten, chrome, titanium, aluminum, silver, gold, or an alloy thereof. Particularly, copper or a copper alloy is preferable in terms of heat dissipation. The lead electrode may have as its surface layer, a coating or light reflective film made of silver, aluminum, rhodium, gold, copper, or an alloy thereof. Among them, silver which has excellent reflectivity is preferable. These wirings can be formed by electrolytic plating, electroless plating, sputtering, vapor deposition, printing, coating, a co-fire method, a post-fire method, and the like.

(Sealing Member 130)

The sealing member is a member for sealing the semiconductor element, the wire, and parts of the wiring and the lead electrodes to protect them against dust or external force. The sealing member preferably has electrical insulating properties. Further, the sealing member can preferably allow light emitted from the semiconductor element structure or light received from the outside of the device to pass therethrough (preferably, to have its transmittance of 70% or more). When the semiconductor element is an electronic element, the sealing member may be integrally formed with the above-mentioned molded body. Specifically, base materials for the sealing member include a silicone resin, an epoxy resin, a phenol resin, a polycarbonate resin, an acryl resin, a TPX resin, a polynorbornene resin, or a modified resin thereof, or a hybrid resin containing one or more kinds of these resins. Further, a base material for the sealing member may be glass. Among them, the silicone resin or a modified resin thereof preferably has excellent resistance to heat and light, and have a little volume contraction after solidification of the resin. In particular, the base material for the sealing member preferably contains a phenyl silicone resin as a principal component. The phenyl silicon resin has excellent gas barrier properties and tends to suppress the degradation of the wiring and the lead electrodes due to corrosive gas. The filler contained in the sealing member can include silicon oxide (silica) or the like.

(Phosphor)

The phosphor absorbs at least a part of a primary light emitted from the semiconductor element structure and then outputs a secondary light with a wavelength different from that of the primary light. Specifically, the phosphors can include an yttrium-aluminum-garnet activated by cerium, a nitrogen-containing calcium aluminosilicate activated by europium and/or chromium, a sialon activated by europium, a silicate activated by europium, potassium fluorosilicate activated by manganese, or the like.

(Wire)

The wire is a conductive wire for connecting the electrode of the semiconductor element to the lead electrode and wiring. Specifically, the wire for use can be a metal wire made of gold, copper, silver, platinum, aluminum, or an alloy thereof. In particular, a gold wire is preferable because the gold wire is less likely to be broken due to stress from the sealing member and has excellent heat resistance or the like. To enhance the light reflectivity, at least the surface of the wire may be formed of silver.

(Bonding Member 120)

The bonding member is a member for bonding the semiconductor element to the lead electrode or wiring. The bonding member having the electrical insulating properties can include epoxy resin, silicone resin, or a modified resin thereof, a hybrid resin, or the like. In order to improve the thermal conductivity, a filler, such as a metal, metal oxide, or metal nitride may be contained in these resins. The conductive bonding member for use can include a metal paste containing metal powder, such as silver, gold, copper, platinum, aluminum, or palladium, and a resin binder; a tin-bismuth based, tin-copper based, tin-silver based, or gold-tin based solder; or a wax made of a low-melting point metal or the like. In addition, the conductive bonding member for use can include a silver particle sintered paste containing silver particles and/or silver oxide particles, and an organic solvent, such as a lower alcohol (see, for example, WO 2009/090915). The silver particle sintered paste can be formed without substantially containing resin. Alternatively, a metal film provided on the lower surface of the semiconductor element can be directly bonded to another metal film provided on a base substrate side (see, for example, WO 2010/0847746).

The semiconductor element can be bonded to the base substrate, for example, by applying a bonding member to the base substrate, placing the semiconductor element thereon, and then heating (pressuring, if necessary) the base substrate. At this time, the bonding member is preferably provided in such an amount as to wet the entire lower surface of the semiconductor element in order to improve the resistance to thermal shock upon bonding between the semiconductor element and the base substrate. The heating temperature (sintering temperature) is preferably 150° C. or higher and 320° C. or lower, and more preferably 160° C. or higher and 280° C. or lower. Bonding is preferably performed in vacuum, or under an inert gas atmosphere, such as argon or nitrogen gas, but may be performed under an air atmosphere. In particular, when the bonding member is the above-mentioned silver particle sintered paste, the bonding is preferably carried out under the air atmosphere or under an oxygen atmosphere.

EXAMPLES

Examples of the present invention will be described in detail below. It is apparent that the present invention is not limited to the following Examples.

Example 1

A semiconductor device of Example 1 is an surface mount-upper surface light emission (top view) type LED having the structure of the semiconductor device 200 shown in FIG. 1 by way of example. The semiconductor device included a base substrate of 5.0 mm in length, 6.5 mm in width, and 1.35 mm in thickness. The base substrate is provided by integrally forming a molded body made of epoxy resin containing white pigment of titanium oxide and a filler of silica, with a pair of positive and negative lead electrodes made of a copper alloy and having a silver coating on its surface. At the substantially center of the base substrate, a two-stepped type recessed portion is formed. The recessed portion formed by the molded body has a circular shape viewed from the top surface side with 4.3 mm in diameter and a depth 0.85 mm in depth. The lead electrode has a part of its surface serving as a part of the bottom surface of the recessed portion, and extended toward the outside of the molded body. Such a base substrate is fabricated by positioning the lead frame in a die, charging material for the molded body into the die, and then curing the material.

At the bottom surface of the recessed portion of the base substrate, 6 semiconductor elements are bonded to the lead electrode on a side of the negative electrode by the bonding member made of gold-tin based solder (having a melting point of about 280° C. and a thickness of about 3.5 μm). The respective electrodes of the semiconductor element are connected to both positive and negative lead electrodes via gold wires. The semiconductor element is a LED element capable of emitting blue light (having a central wavelength of about 455 nm), and having 460 μm in length, 460 μm in width, and 120 μm in thickness. The semiconductor element has the light emitting element structure including an n-type layer made of a nitride semiconductor, an active layer, and a p-type layer, which were stacked in that order over an upper surface of the substrate made of aluminum oxide (sapphire). The semiconductor element includes a metal film formed in contact with a lower surface of the substrate made of aluminum oxide. The metal film contains silver as a principal component, and 4% by weight of nanoparticles made of zirconium oxide. The metal film is formed in a thickness of 120 nm by sputtering (that is, co-sputtering of silver and zirconium oxide). The particle diameter of the nanoparticle of the zirconium oxide is in a range of about 1 to 3 nm. The purity of silver is 99.99%, and the crystal grain size of the silver is about 100 nm. A bonding film including a lamination of a nickel film (of 100 nm in thickness), a rhodium film (of 200 nm in thickness), and a gold film (500 nm in thickness) is formed under the metal film. A sputtering device used herein is SPF-530H manufactured by Canon Anelva Corporation (in the following examples, the same way was carried out).

The sealing member is provided within the recessed portion of the base substrate to cover the semiconductor elements. The sealing member includes a phenyl silicone resin having a refractive index of 1.53 as a base material, and a YAG phosphor diffused in the resin. The sealing member is charged to fill the recessed portion of the base substrate with its upper surface made substantially flat. Such a sealing member is formed by falling the fluid raw material dropwise from a dispenser, and heating and solidifying the material.

Example 2

A semiconductor device of Example 2 differs from the semiconductor device of Example 1 in that the content of the nanoparticles made of the zirconium oxide in the metal film is changed to 2% by weight.

Example 3

A semiconductor device of Example 3 differs from the semiconductor device of Example 1 in that the content of the nanoparticles made of the zirconium oxide in the metal film is changed to 1% by weight.

Example 4

A semiconductor device of Example 4 differs from the semiconductor device of Example 1 in that the content of the nanoparticles made of the zirconium oxide in the metal film is changed to 0.5% by weight.

Comparative Example 1

A semiconductor device of Comparative Example 1 differs from the semiconductor device of Example 1 in that a metal film is fabricated without adding any nanoparticle.

(Evaluation 1)

In respective semiconductor devices of Examples 1 to 4 and Comparative Example 1, the bonding strength (share strength) of each semiconductor element is measured before the sealing process. The bonding strength is respectively measured before performing (0 time) a heat treatment (at a peak temperature of 260° C., and in a reflow pass test for 10 seconds or less) on the semiconductor device, after performing the heat treatment once, after performing the heat treatment twice, and after performing the heat treatment third times. The results of measurements are shown in Table 6.

Figure 6:
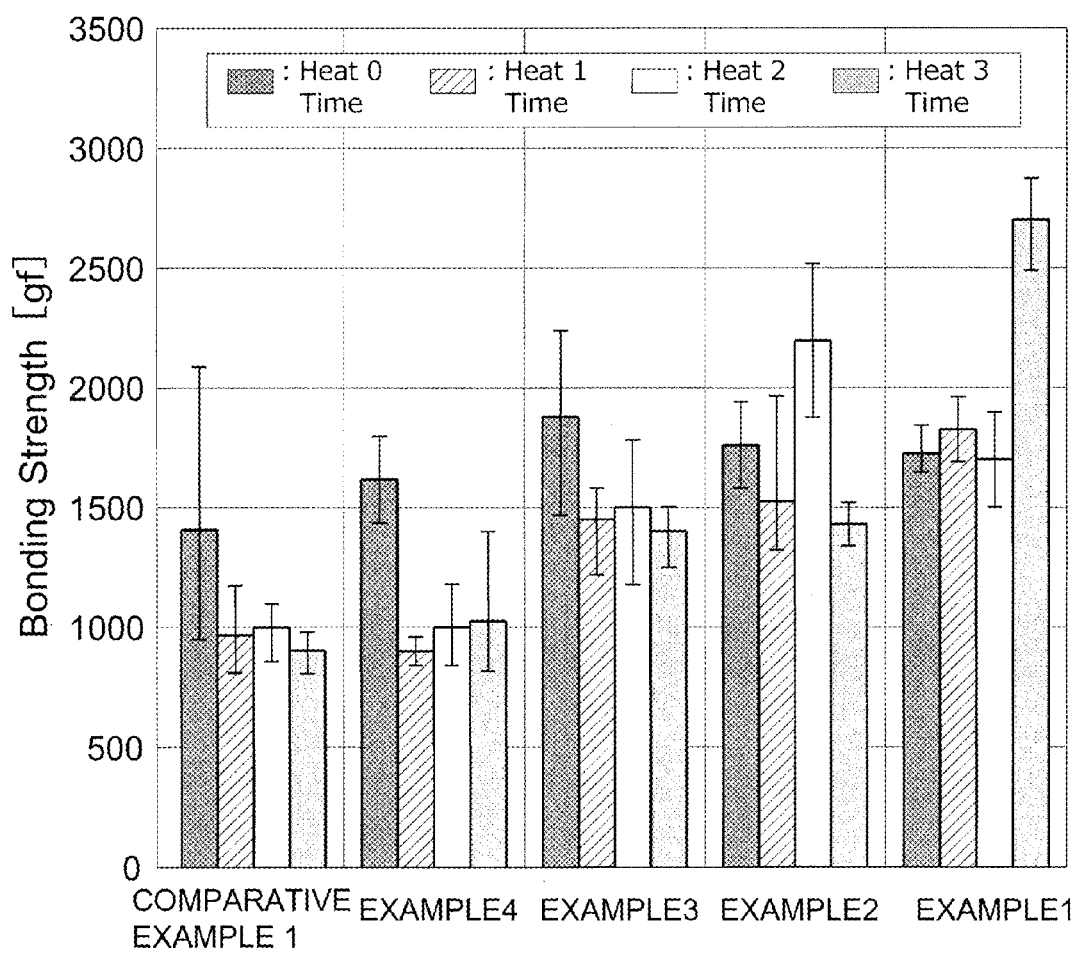
FIG. 6 is a graph showing a bonding strength of the metal film in each of Examples of the present invention and Comparative Example.

FIG. 6 is a graph showing the bonding strength of the metal film in each of Examples 1 to 4 and Comparative Example 1. As shown in FIG. 6, the metal film in each of Examples 1 to 4 has the higher bonding strength as compared to the metal film of Comparative Example 1. As the content of the nanoparticles of the zirconium oxide in the metal film is increased, the bonding strength is also increased. This shows that the presence of the nanoparticles made of zirconium oxide enhances the adhesion of the metal film to the substrate. In Comparative Example 1, the semiconductor device is observed to have a lot of breaks at an interface between a substrate and a metal film. On the other hand, in Examples 1 to 4, the semiconductor device is observed to have a lot of breaks at a part of the bonding member.

As mentioned above, as a preferred example, the substrate is made of aluminum oxide, and that nanoparticles are made of zirconium oxide.

Example 5

In Example 5, a titanium film is deposited in a thickness of 100 nm on an upper surface of a substrate for a test, which is a slide glass 1-9645-01 (of a separation type) manufactured by As One corporation by sputtering. On the titanium film, another film as a sample of the metal film is deposited in a thickness of 500 nm which contains 4.1% by weight of the nanoparticles made of aluminum oxide, and silver as a principal component.

The process conditions were as follows. A pressure that is reached before the process is 5.0 e−4 Pa. Before the deposition, the upper surface of the substrate for a test is cleaned by reverse-sputtering under the following conditions: RF 250 W, 1 minute, 0.5 Pa, and Ar: 50 sccm. A titanium film is deposited using a titanium target having a diameter of 4 inches under the following conditions: RF 500 W, 18 min 35 sec, 0.5 Pa, and Ar: 50 sccm. A sample of a metal film is deposited by co-sputtering on the following conditions: RF 100 W for an aluminum oxide target having a diameter of 4 inches; and RF 60 W for a silver target having a diameter of 4 inches, for 120 minutes at a pressure 0.5 Pa, and Ar: 50 sccm. In deposition, a substrate holder for tests is rotated at 6 rpm to be cooled to about the ordinary temperature.

Figure 7:
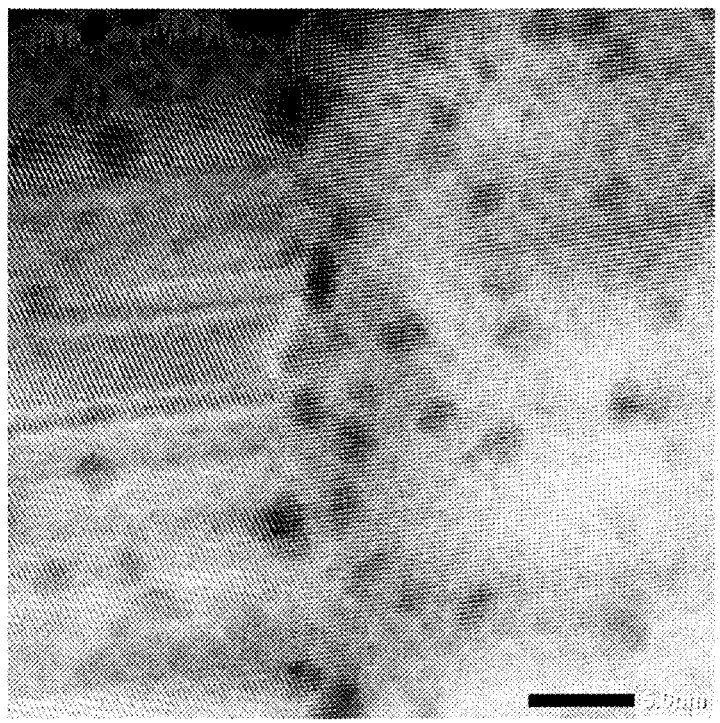
FIG. 7 is an image of one section of the metal film observed by a scanning transmission electron microscope in one Example of the present invention.

FIG. 7 is an image of one section of the metal film observed by a scanning transmission electron microscope (JEM-ARM200F (Cold-FEG) manufactured by JEOL Ltd.) in Example 5. As shown in FIG. 7, the metal film in Example 5 has nanoparticles of aluminum oxide (black spots shown in FIG. 7) existing in silver crystal grain boundaries. Further, the nanoparticles of aluminum oxide also existed in regions other than the silver crystal grain boundaries in the metal film. The particle diameter of the nanoparticle of aluminum oxide was in a range of about 1.0 nm to 3.0 nm.

Example 6

A sample of Example 6 differs from the sample of Example 5 in that the content of nanoparticles of the aluminum oxide in the metal film is changed to 2.5% by weight.

Comparative Example 2

A sample of Comparative Example 2 differs from the sample of Example 5 in that the sample is fabricated without adding any nanoparticle.

(Evaluation 2)

In each of the samples of Examples 5, 6, and Comparative Example 2, the reflectivity of the metal film is measured before and after a heat treatment (conditions: in the air atmosphere, at 250° C., for 2 hours). The measurement wavelength is 450 nm. The results of measurements are shown in Table 1.

TABLE 1

|  | Example 5 | Example 6 | Comparative Example 2 |
| --- | --- | --- | --- |
| Nanoparticle content [wt %] | 4.1 | 2.5 | 0 |
| Reflectivity [%] Before heating | 90.6 | 95.5 | 97.0 |
| After heating | 89.9 | 94.9 | 90.7 |
| Reflectivity retention rate [%] | 99.2 | 99.4 | 93.5 |

As shown in Table 1, the metal film of each of Examples 5 and 6 hardly changes its reflectivity before and after the heat treatment, and the presence of the nanoparticles of aluminum oxide suppresses the crystal growth due to the thermal history of the metal film. By controlling the content of nanoparticles in the metal film, for example, to 4% by weight or less, it can be seen that a high initial reflectivity can be easily obtained, and that the reflectivity can also be easily maintained.

Example 7

A sample of Example 7 differs from the sample of Example 5 in that the nanoparticle is changed to that made of zirconium oxide. The metal film of Example 7 has a reflectivity before the heat treatment (condition: as above) of 92.6%, another reflectivity after the heat treatment of 89.8%, and a reflectivity retention rate of 97.0%. The metal film of Example 7 suppresses the decrease in reflectivity before and after the heat treatment as compared to Comparative Example 2. The presence of the nanoparticles of zirconium oxide suppresses the crystal growth due to the thermal history of the metal film.

Now, the metal films containing the nanoparticles other than zirconium oxide are evaluated for adhesion to the substrate.

Example 8

A semiconductor device of Example 8 differs from the semiconductor device of Example 1 in that the nanoparticles of the metal film are changed to that made of zinc oxide.

Example 9

A semiconductor device of Example 9 differs from the semiconductor device of Example 1 in that the nanoparticles of the metal film are changed to that made of nickel oxide.

Example 10

A semiconductor device of Example 10 differs from the semiconductor device of Example 1 in that the nanoparticles of the metal film are changed to that made of hafnium oxide.

Comparative Example 3

A semiconductor device of Comparative Example 3 differs from the semiconductor device of Example 8 in that the metal film is fabricated without adding any nanoparticle.

Example 11

A semiconductor device of Example 11 differs from the semiconductor device of Example 1 in that the nanoparticles of the metal film is changed to that made of tin oxide.

Example 12

A semiconductor device of Example 12 differs from the semiconductor device of Example 1 in that the nanoparticles made of the zirconium oxide in the metal film are limited to particles dispersedly attached to the lower surface of the substrate. The metal film is formed by sputtering zirconium oxide in a very small thickness (in a thickness of about several nm) to dispersedly attach the nanoparticles of zirconium oxide to the lower surface of the substrate, and depositing silver thereon by sputtering.

Comparative Example 4

A semiconductor device of Comparative Example 4 differs from the semiconductor device of Example 11 in that the metal film is fabricated without adding any nanoparticle.
(Evaluation 3)

In respective semiconductor devices of Examples 8 to 12 and Comparative Examples 3 and 4, the bonding strength (share strength) of each semiconductor element is measured before the sealing step. The bonding strength is respectively measured before performing (0 time) a heat treatment (at a peak temperature of 260° C., and in a reflow pass test for 10 seconds or less) on the semiconductor device, after performing the heat treatment once, after performing the heat treatment twice, and after performing the heat treatment third times. The results of measurements are shown in FIGS. 8 and 9.

Figure 8:
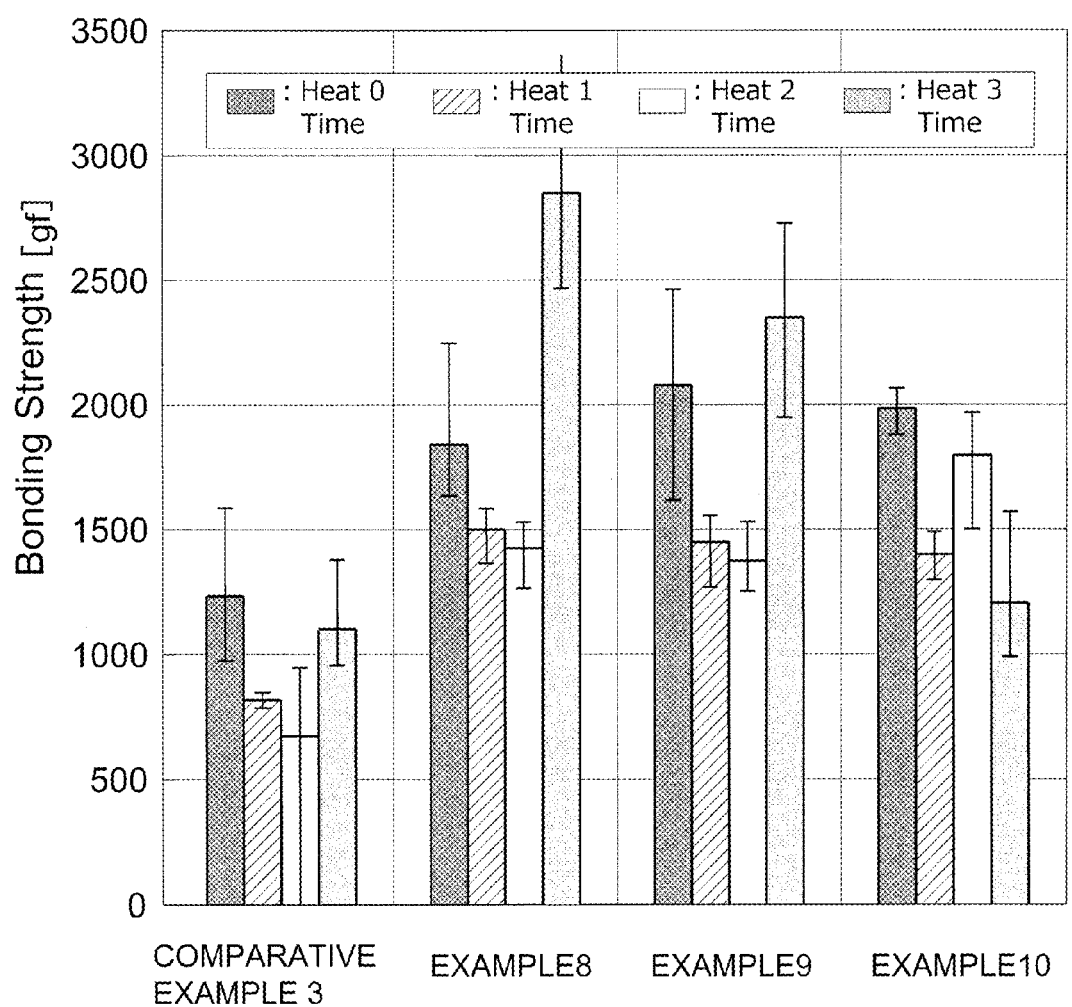
FIG. 8 is a graph showing a bonding strength of the metal film in each of Examples of the present invention and Comparative Example.
Figure 9:
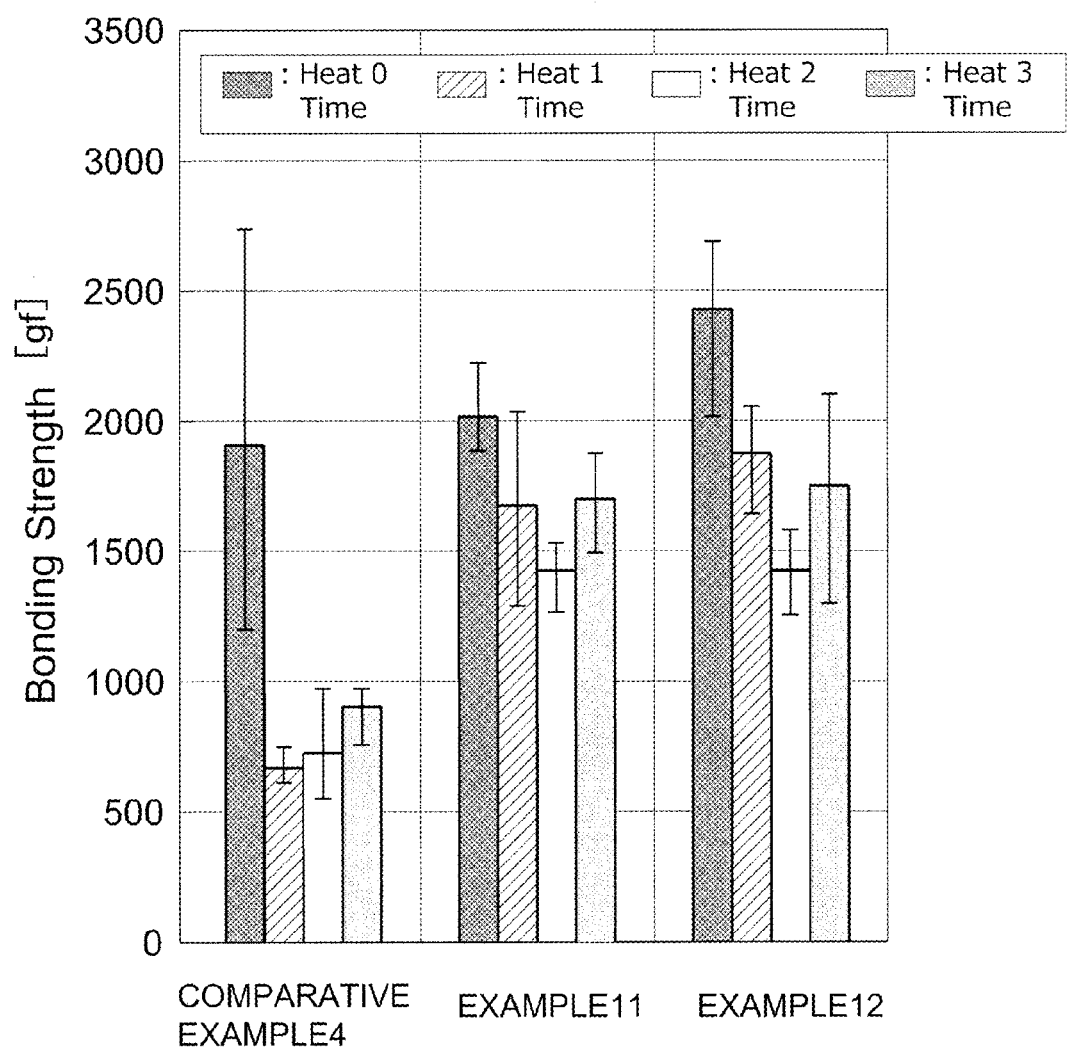
FIG. 9 is a graph showing a bonding strength of the metal film in each of Examples of the present invention and Comparative Example.

FIG. 8 is a graph showing the bonding strength of the metal film in each of Examples 8 to 10 and Comparative Example 3. FIG. 9 is a graph showing the bonding strength of the metal film in each of Examples 11 and 12 and Comparative Example 4. As shown in FIGS. 8 and 9, the metal films of Examples 8 to 12 have a higher bonding strength than that of the metal films of Comparative Examples 3 and 4. This shows that the metal film containing nanoparticles made of zinc oxide, nickel oxide, hafnium oxide, or tin oxide improve the adhesion to the substrate. Further, it is found that the metal film containing nanoparticles of zirconium oxide dispersedly attached to the lower surface of the substrate can also improve the adhesion to the substrate.

Example 13

As Example 13, like Example 5, a titanium film is deposited in a thickness of 50 nm over the upper surface of a slide glass by sputtering, and then, a film containing 4% by weight of nanoparticles of zirconium oxide and silver as a principal component is deposited thereon in a thickness of 500 nm as a sample of the metal film by co-sputtering.

Example 14

A semiconductor device of Example 14 differs from the semiconductor device of Example 13 in that the nanoparticles of the metal film are changed to that made of hafnium oxide.
(Evaluation 4)

Figure 10A:
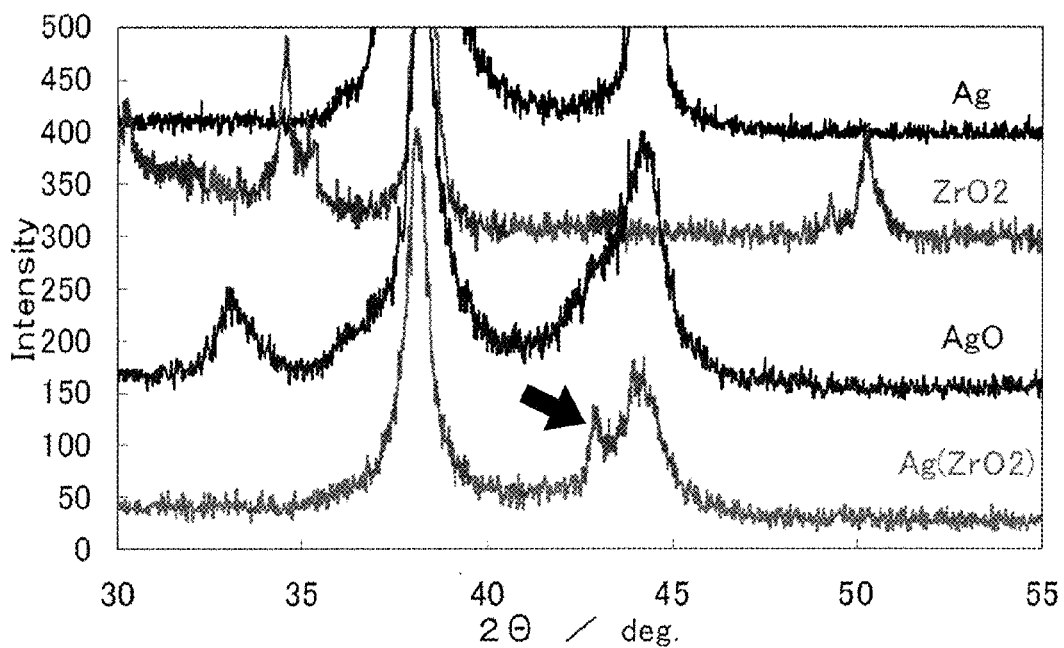
FIGS. 10A and 10B are graphs showing the result of measurement of X-ray diffraction of the metal film in Examples of the present invention.
Figure 10B:
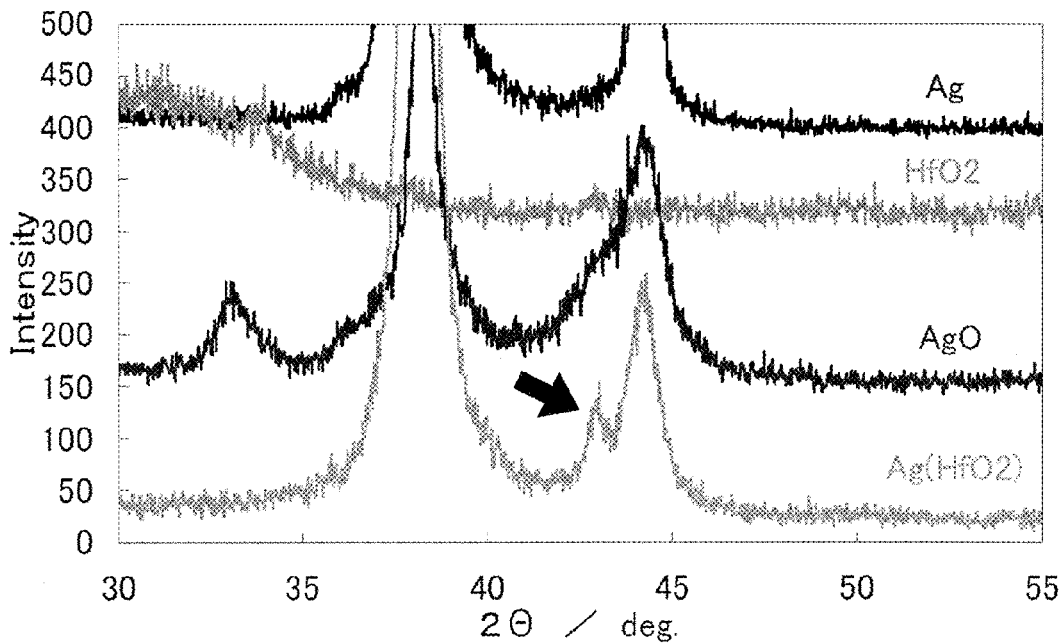

FIG. 10A and FIG. 10B are respectively graphs showing the results of measurements of X-ray diffraction (XRD) of the metal film in Examples 13 and 14, respectively. As shown in FIGS. 10A and 10B, the metal films of Examples 13 and 14 are observed to have a specific peak near 43°. From this fact, it is supposed that a chemical bond or a composite oxide of silver-zirconium or silver-oxygen-zirconium in the metal film of Example 13 and a chemical bond or a composite oxide of silver-hafnium or silver-oxygen-hafnium in the metal film of Example 14 exist, which might be one of factors that enhance the adhesion with the substrate.

Figure 11:
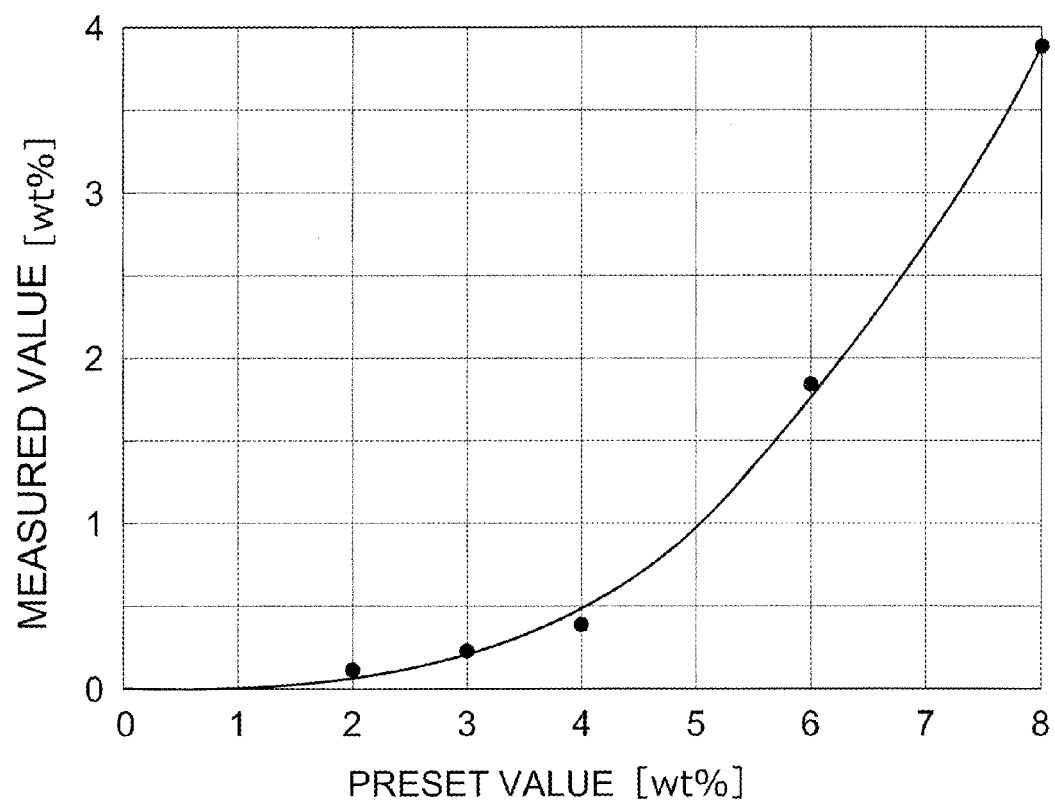
FIG. 11 is a graph showing the relationship between the preset value of a nanoparticle content in the metal film by a sputtering device and a measured value by an inductively-coupled plasma emission spectrophotometer.

Finally, FIG. 11 is a graph showing the relationship between the preset value of a nanoparticle content in the metal film by a sputtering device, and a measured value by an inductively-coupled plasma emission spectrophotometer (ICP-AES device). As can be seen from FIG. 11, the measured value of the nanoparticle content in the metal film is smaller than a preset value by the sputtering device, which does not produce the normal linear relationship. This is because the RF power of the sputtering device is required to be set relatively low in order to control the content of the nanoparticles in the metal film to a minute amount. Although the nanoparticles are made of zirconium oxide, other nanoparticles also tend to have substantially the same behavior. All contents of the nanoparticles in the metal film in the embodiments and Examples mentioned above are preset values set by the deposition device. Accordingly, the content of the nanoparticles in the metal film as the measured value is, e.g. 1% by weight or less, and preferably, 0.5% by weight or less.

The semiconductor device according to the embodiments of the present invention in which the semiconductor element is the light emitting element or light receiving element can be applied to a backlight source of a liquid crystal display, various illumination tools, a large-sized display, various types of display devices dedicated for advertisement, destination guidance, etc., a projector device, and further image readers, such as a digital video camera, a fax machine, a copy machine, or a scanner, various sensors, and the like. The semiconductor device according to the present invention in which the semiconductor element is the electron element can be applied to various electronic calculators, such as a personal computer, circuit substrates mounted on the calculator, and the like.

DESCRIPTION OF REFERENCE NUMERALS

10 Substrate
20 Semiconductor Element Structure
30 Metal film (31 Crystal grain, 31a Metal raw material, 35 Nanoparticle, 35a Raw material for nanoparticle)
100 Semiconductor element
110 Base substrate
120 Bonding member
130 Sealing member
200 Semiconductor device

What is claimed is:

1. A method of manufacturing a light emitting element, the method comprising:
    forming a light emitting element structure on an upper surface of a substrate made of an oxide; and
    simultaneously depositing a metal and a further oxide on a lower surface of the substrate by sputtering or vapor deposition to form a film of the metal containing nanoparticles of the further oxide.

2. The method according to claim 1, wherein the substrate is made of aluminum oxide.

3. The method according to claim 1, wherein the nanoparticles include at least one material selected from a group consisting of silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, nickel oxide, hafnium oxide, ITO($In_2O_3$:Sn), IZO(ZnO:In), AZO (ZnO:Al), GZO(ZnO:Ga) and FTO($SnO_2$:F).

4. The method according to claim 1, wherein the nanoparticles include at least one element selected from a Group 4 element, a Group 10 element, a Group 12 element, a Group 13 element, and a Group 14 element.

5. The method according to claim 1, wherein the metal includes silver.

6. A method of manufacturing a light emitting element, the method comprising:
    forming a light emitting element structure on an upper surface of a substrate made of an oxide;
    dispersedly attaching nanoparticles of a further oxide onto a lower surface of the substrate by sputtering or vapor deposition; and subsequently
    forming a metal film to cover the nanoparticles.

7. The method according to claim 6, wherein the substrate is made of aluminum oxide.

8. The method according to claim 6, wherein the nanoparticles include at least one material selected from a group consisting of silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, nickel oxide, hafnium oxide, ITO($In_2O_3$:Sn), IZO(ZnO:In), AZO (ZnO:Al), GZO(ZnO:Ga) and FTO($SnO_2$:F).

9. The method according to claim 6, wherein the nanoparticles include at least one element selected from a Group 4 element, a Group 10 element, a Group 12 element, a Group 13 element, and a Group 14 element.

10. The method according to claim 6, wherein the metal includes silver.

11. A method of manufacturing a light emitting element, the method comprising:
    forming a light emitting element structure on an upper surface of a substrate made of a nitride; and
    simultaneously depositing a metal and a further nitride on a lower surface of the substrate by sputtering or vapor deposition to form a film of the metal containing nanoparticles of the further nitride.

12. The method according to claim 11, wherein the substrate is made of a material represented by $Al_xGa_{1-x}N$ ($0 \leq x \leq 1$).

13. The method according to claim 11, wherein the nanoparticles include at least one material selected from a group consisting of silicon nitride, aluminum nitride, zirconium nitride, titanium nitride, zinc nitride, magnesium nitride, gallium nitride, tantalum nitride, niobium nitride, bismuth nitride, yttrium nitride, iridium nitride, indium nitride, tin nitride, nickel nitride, and hafnium nitride.

14. The method according to claim 11, wherein the metal includes silver.

15. A method of manufacturing a light emitting element, the method comprising:
    forming a light emitting element structure on an upper surface of a substrate made of a nitride,
    dispersedly attaching nanoparticles of a further nitride onto a lower surface of the substrate by sputtering or vapor deposition; and subsequently
    forming the metal film to cover the nanoparticles.

16. The method according to claim 15, wherein the substrate is made of a material represented by $Al_xGa_{1-x}N$ ($0 \leq x \leq 1$).

17. The method according to claim 15, wherein the nanoparticles include at least one material selected from a group consisting of silicon nitride, aluminum nitride, zirconium nitride, titanium nitride, zinc nitride, magnesium nitride, gallium nitride, tantalum nitride, niobium nitride, bismuth nitride, yttrium nitride, iridium nitride, indium nitride, tin nitride, nickel nitride, and hafnium nitride.

18. The method according to claim 15, wherein the metal includes silver.

19. A method of manufacturing a light emitting element, the method comprising:
    forming a light emitting element structure on an upper surface of a substrate made of a carbide; and
    simultaneously depositing a metal and a further carbide on a lower surface of the substrate by sputtering or vapor deposition to form a film of the metal containing nanoparticles of the further carbide.

20. The method according to claim 19, wherein the substrate is made of a silicon carbide.

21. The method according to claim 19, wherein the nanoparticles include at least one material selected from a group consisting of silicon carbide, zirconium carbide, titanium carbide, tantalum carbide, niobium carbide, yttrium carbide, and hafnium carbide.

22. The method according to claim 19, wherein the metal includes silver.

23. A method of manufacturing a light emitting element, the method comprising:
    forming a light emitting element structure on an upper surface of a substrate made of a carbide;
    dispersedly attaching nanoparticles of a further carbide onto a lower surface of the substrate by sputtering or vapor deposition; and subsequently
    forming the metal film to cover the nanoparticles.

24. The method according to claim 23, wherein the substrate is made of a silicon carbide.

25. The method according to claim 23, wherein the nanoparticles include at least one material selected from a group consisting of silicon carbide, zirconium carbide, titanium carbide, tantalum carbide, niobium carbide, yttrium carbide, and hafnium carbide.

26. The method according to claim 23, wherein the metal includes silver.

* * * * *